(12) United States Patent
Khlat et al.

(10) Patent No.: US 10,637,408 B2
(45) Date of Patent: Apr. 28, 2020

(54) ENVELOPE TRACKING VOLTAGE TRACKER CIRCUIT AND RELATED POWER MANAGEMENT CIRCUIT

(71) Applicant: Qorvo US, Inc., Greensboro, NC (US)

(72) Inventors: Nadim Khlat, Cugnaux (FR); Michael R. Kay, Summerfield, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/986,948

(22) Filed: May 23, 2018

(65) Prior Publication Data

US 2019/0222178 A1    Jul. 18, 2019

Related U.S. Application Data

(60) Provisional application No. 62/618,828, filed on Jan. 18, 2018.

(51) Int. Cl.
*H03F 1/32*    (2006.01)
*H03F 3/21*    (2006.01)
*H03F 3/19*    (2006.01)
*H03F 1/02*    (2006.01)
(Continued)

(52) U.S. Cl.
CPC .............. *H03F 1/32* (2013.01); *H02M 3/07* (2013.01); *H03F 1/0227* (2013.01); *H03F 1/0238* (2013.01); *H03F 3/19* (2013.01); *H03F 3/21* (2013.01); *H02M 2001/0045* (2013.01); *H03F 2200/105* (2013.01); *H03F 2200/129* (2013.01); *H03F 2200/451* (2013.01); *H03F 2201/3215* (2013.01)

(58) Field of Classification Search
USPC ........ 330/296–297, 136, 291, 127, 129, 279
See application file for complete search history.

(56) References Cited

U.S. PATENT DOCUMENTS 5,838,732 A    11/1998   Carney
7,043,213 B2    5/2006   Robinson et al.
7,471,155 B1   12/2008   Levesque
(Continued)

OTHER PUBLICATIONS

U.S. Appl. No. 15/704,131, filed Sep. 14, 2017.
(Continued)

*Primary Examiner* — Hieu P Nguyen
(74) *Attorney, Agent, or Firm* — Withrow & Terranova, P.L.L.C.

(57) ABSTRACT

An envelope tracking (ET) voltage tracker circuit and related power management circuit are provided. In examples discussed herein, an amplifier circuit(s) is configured to amplify a radio frequency (RF) signal(s) based on an ET modulated voltage provided by an ET voltage tracker circuit(s). The ET voltage tracker circuit(s) includes amplifier circuitry, which operates based on an ET target voltage and a bias current to generate the ET modulated voltage. However, the ET modulated voltage may deviate from the ET target voltage from time to time due to cross over distortions. In this regard, the ET voltage tracker circuit includes a bias modulation circuit to dynamically determine the cross over distortion and adjust the bias current to reduce deviations of the ET modulated voltage. As a result, the ET modulated voltage can track the ET target voltage more closely, thus helping to improve linearity performance and efficiency of the amplifier circuit(s).

20 Claims, 5 Drawing Sheets

(51) Int. Cl.
*H02M 3/07* (2006.01)
*H02M 1/00* (2006.01)

(56) References Cited

U.S. PATENT DOCUMENTS

| | | | |
|---|---|---|---|
| 7,570,931 | B2 | 8/2009 | McCallister et al. |
| 8,461,928 | B2 | 6/2013 | Yahav et al. |
| 8,718,188 | B2 | 5/2014 | Balteanu et al. |
| 8,725,218 | B2 | 5/2014 | Brown et al. |
| 8,774,065 | B2 | 7/2014 | Khlat et al. |
| 8,803,603 | B2 | 8/2014 | Wimpenny |
| 8,879,665 | B2 | 11/2014 | Xia et al. |
| 8,913,690 | B2 | 12/2014 | Onishi |
| 8,989,682 | B2 | 3/2015 | Ripley et al. |
| 9,041,365 | B2 | 5/2015 | Kay et al. |
| 9,065,509 | B1 | 6/2015 | Yon et al. |
| 9,069,365 | B2 | 6/2015 | Brown et al. |
| 9,098,099 | B2 | 8/2015 | Park et al. |
| 9,166,830 | B2 | 10/2015 | Camuffo et al. |
| 9,197,182 | B2 | 11/2015 | Baxter et al. |
| 9,225,362 | B2 | 12/2015 | Drogi et al. |
| 9,263,997 | B2 | 2/2016 | Vinayak |
| 9,280,163 | B2 | 3/2016 | Kay et al. |
| 9,288,098 | B2 | 3/2016 | Yan et al. |
| 9,344,304 | B1 | 5/2016 | Cohen |
| 9,356,512 | B2 | 5/2016 | Chowdhury et al. |
| 9,515,622 | B2 | 12/2016 | Nentwig et al. |
| 9,520,907 | B2 | 12/2016 | Peng et al. |
| 9,584,071 | B2 | 2/2017 | Khlat |
| 9,595,981 | B2 | 3/2017 | Khlat |
| 9,748,845 | B1 | 8/2017 | Kotikalapoodi |
| 9,806,676 | B2 | 10/2017 | Balteanu et al. |
| 9,831,834 | B2 * | 11/2017 | Balteanu ............ H02M 3/155 |
| 9,923,520 | B1 | 3/2018 | Abdelfattah et al. |
| 10,003,416 | B1 | 6/2018 | Lloyd |
| 10,110,169 | B2 | 10/2018 | Khesbak et al. |
| 10,170,989 | B2 | 1/2019 | Balteanu et al. |
| 2004/0266366 | A1 | 12/2004 | Robinson et al. |
| 2005/0090209 | A1 | 4/2005 | Behzad |
| 2005/0232385 | A1 | 10/2005 | Yoshikawa et al. |
| 2006/0240786 | A1 | 10/2006 | Liu |
| 2007/0052474 | A1 | 3/2007 | Saito |
| 2009/0045872 | A1 | 2/2009 | Kenington |
| 2010/0308919 | A1 | 12/2010 | Adamski et al. |
| 2011/0136452 | A1 | 6/2011 | Pratt et al. |
| 2011/0175681 | A1 | 7/2011 | Inamori et al. |
| 2011/0279179 | A1 | 11/2011 | Vice |
| 2012/0194274 | A1 | 8/2012 | Fowers et al. |
| 2012/0200435 | A1 | 8/2012 | Ngo et al. |
| 2012/0299645 | A1 | 11/2012 | Southcombe et al. |
| 2012/0299647 | A1 | 11/2012 | Honjo et al. |
| 2013/0021827 | A1 | 1/2013 | Ye |
| 2013/0100991 | A1 | 4/2013 | Woo |
| 2013/0130724 | A1 | 5/2013 | Kumar Reddy et al. |
| 2013/0187711 | A1 | 7/2013 | Goedken et al. |
| 2013/0200865 | A1 | 8/2013 | Wimpenny |
| 2014/0009226 | A1 | 1/2014 | Severson |
| 2014/0028370 | A1 | 1/2014 | Wimpenny |
| 2014/0028390 | A1 | 1/2014 | Davis |
| 2014/0103995 | A1 | 4/2014 | Langer |
| 2014/0155002 | A1 | 6/2014 | Dakshinamurthy et al. |
| 2014/0184335 | A1 | 7/2014 | Nobbe et al. |
| 2014/0210550 | A1 | 7/2014 | Mathe et al. |
| 2014/0218109 | A1 | 8/2014 | Wimpenny |
| 2014/0235185 | A1 | 8/2014 | Drogi |
| 2014/0266423 | A1 | 9/2014 | Drogi et al. |
| 2014/0266428 | A1 | 9/2014 | Chiron et al. |
| 2014/0315504 | A1 | 10/2014 | Sakai et al. |
| 2014/0361830 | A1 | 12/2014 | Mathe et al. |
| 2015/0071382 | A1 | 3/2015 | Wu et al. |
| 2015/0188432 | A1 | 7/2015 | Vannorsdel et al. |
| 2015/0236654 | A1 | 8/2015 | Jiang et al. |
| 2015/0236729 | A1 | 8/2015 | Peng et al. |
| 2015/0280652 | A1 | 10/2015 | Cohen |
| 2015/0333781 | A1 | 11/2015 | Alon et al. |
| 2016/0065137 | A1 | 3/2016 | Khlat |
| 2016/0099687 | A1 | 4/2016 | Khlat |
| 2016/0105151 | A1 | 4/2016 | Langer |
| 2016/0118941 | A1 | 4/2016 | Wang |
| 2016/0187627 | A1 | 6/2016 | Abe |
| 2016/0197627 | A1 | 7/2016 | Qin et al. |
| 2016/0294587 | A1 | 10/2016 | Jiang et al. |
| 2017/0141736 | A1 | 5/2017 | Pratt et al. |
| 2017/0317913 | A1 | 11/2017 | Kim et al. |
| 2017/0338773 | A1 | 11/2017 | Balteanu et al. |
| 2018/0048276 | A1 | 2/2018 | Khlat et al. |
| 2018/0076772 | A1 | 3/2018 | Khesbak et al. |
| 2018/0309414 | A1 | 10/2018 | Khlat et al. |
| 2018/0367101 | A1 | 12/2018 | Chen et al. |

OTHER PUBLICATIONS

U.S. Appl. No. 15/728,202, filed Oct. 9, 2017.
U.S. Appl. No. 15/792,909, filed Oct. 25, 2017.
U.S. Appl. No. 15/888,260, filed Feb. 5, 2018.
U.S. Appl. No. 15/888,300, filed Feb. 5, 2018.
U.S. Appl. No. 15/984,566, filed May 21, 2018.
U.S. Appl. No. 15/902,244, filed Feb. 22, 2018.
Non-Final Office Action for U.S. Appl. No. 14/836,634, dated May 16, 2016, 9 pages.
Non-Final Office Action for U.S. Appl. No. 14/868,890, dated Jul. 14, 2016, 13 pages.
Non-Final Office Action for U.S. Appl. No. 15/792,909, dated May 18, 2018, 13 pages.
Notice of Allowance for U.S. Appl. No. 15/459,449, dated Mar. 28, 2018, 7 pages.
Notice of Allowance for U.S. Appl. No. 15/723,460, dated Jul. 24, 2018, 8 pages.
Notice of Allowance for U.S. Appl. No. 15/704,131, dated Jul. 17, 2018, 7 pages.
Notice of Allowance for U.S. Appl. No. 15/728,202, dated Aug. 2, 2018, 7 pages.
Non-Final Office Action for U.S. Appl. No. 15/888,300, dated Aug. 28, 2018, 11 pages.
Final Office Action for U.S. Appl. No. 15/888,300, dated Feb. 15, 2019, 15 pages.
Non-Final Office Action for U.S. Appl. No. 16/018,426, dated Apr. 11, 2019, 11 pages.
Supplemental Notice of Allowability for U.S. Appl. No. 15/902,244, dated Mar. 20, 2019, 6 pages.
Notice of Allowance for U.S. Appl. No. 15/902,244, dated Feb. 8, 2019, 8 pages.
Pfister, Henry, "Discrete-Time Signal Processing," Lecture Note, pfister.ee.duke.edu/courses/ece485/dtsp.pdf, Mar. 3, 2017, 22 pages.
Advisory Action for U.S. Appl. No. 15/888,300, dated Jun. 5, 2019, 3 pages.
Non-Final Office Action for U.S. Appl. No. 15/888,260, dated May 2, 2019, 14 pages.
Notice of Allowance for U.S. Appl. No. 15/984,566, dated May 21, 2019, 6 pages.
Notice of Allowance for U.S. Appl. No. 16/150,556, dated Jul. 29, 2019, 7 pages.
Non-Final Office Action for U.S. Appl. No. 15/888,300, dated Jun. 27, 2019, 17 pages.
Final Office Action for U.S. Appl. No. 16/018,426, mailed Sep. 4, 2019, 12 pages.
Advisory Action for U.S. Appl. No. 16/018,426, dated Nov. 19, 2019, 3 pages.
Notice of Allowance for U.S. Appl. No. 16/180,887, dated Jan. 13, 2020, 8 pages.
Notice of Allowance for U.S. Appl. No. 15/888,300, dated Jan. 14, 2020, 11 pages.
Corrected Notice of Allowability for U.S. Appl. No. 15/888,300, dated Feb. 25, 2020, 7 pages.
Non-Final Office Action for U.S. Appl. No. 16/174,535, dated Feb. 4, 2020, 7 pages.

* cited by examiner

ENVELOPE TRACKING VOLTAGE TRACKER CIRCUIT AND RELATED POWER MANAGEMENT CIRCUIT

RELATED APPLICATIONS

This application claims the benefit of provisional patent application Ser. No. 62/618,828, filed Jan. 18, 2018, the disclosure of which is hereby incorporated herein by reference in its entirety.

FIELD OF THE DISCLOSURE

The technology of the disclosure relates generally to generating an envelope tracking (ET) voltage(s) for a power amplifier circuit(s).

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as fifth generation new radio (5G-NR) and Wi-Fi that typically operates in higher frequency spectrums. To achieve higher data rates with increased robustness in the higher frequency spectrums, the mobile communication devices may employ multiple antennas to enable multiple-input multiple-output (MIMO) and/or beamforming operations. Sophisticated power amplifiers (PAs) may be employed to increase output power of radio frequency (RF) signals (e.g., maintaining sufficient energy per bit) prior to transmitting the RF signals from the multiple antennas. However, the increased number of antennas and PAs can lead to increased power dissipation in the mobile communication devices, thus compromising overall performance and user experiences.

Envelope tracking (ET) is a power management technology designed to improve efficiency levels of the PAs to help reduce power dissipation in the mobile communication devices. As the name suggests, an ET system receives an ET target voltage(s) associated with a time-variant target voltage envelope and generates an ET modulated voltage(s) having a time-variant voltage envelope that keeps track of the time-variant target voltage envelope. Accordingly, the PAs can be configured to amplify the RF signals based on the ET modulated voltage(s). Given that the time-variant target voltage envelope of the ET target voltage(s) may be correlated with time-variant amplitudes of the RF signals, the PAs may operate at improved linearity and efficiency if the ET modulated voltage(s) can closely track the ET target voltage(s) at all times. However, the ET modulate voltage(s) may deviate from the ET target voltage(s) from time to time due to cross over distortion, thus compromising linear performance of the PAs. As such, it may be desirable to dynamically detect and reduce the cross over distortion to help maintain linearity and efficiency in the PAs.

SUMMARY

Embodiments of the disclosure relate to an envelope tracking (ET) voltage tracker circuit and related power management circuit. In examples discussed herein, an ET power management circuit includes an amplifier circuit(s) configured to amplify a radio frequency (RF) signal(s) based on an ET modulated voltage provided by an ET voltage tracker circuit(s). The ET voltage tracker circuit(s) includes amplifier circuitry, which operates based on an ET target voltage and a bias current to generate the ET modulated voltage. However, the ET modulated voltage may deviate from the ET target voltage from time to time due to cross over distortions in the ET voltage tracker circuit(s). In this regard, the ET voltage tracker circuit includes a bias modulation circuit to dynamically determine the cross over distortion and adjust the bias current to reduce deviations of the ET modulated voltage. As a result, the ET modulated voltage can track the ET target voltage more closely, thus helping to improve linearity performance and efficiency of the amplifier circuit(s).

In one aspect, an ET voltage tracker circuit is provided. The ET voltage tracker circuit includes amplifier circuitry including a voltage output. The amplifier circuitry is configured to operate based on an ET target voltage and a bias current to generate an ET modulated voltage at the voltage output. The amplifier circuitry is also configured to cause an alternating current to flow through the voltage output. The ET voltage tracker circuit also includes a bias modulation circuit. The bias modulation circuit is configured to determine whether a level of the alternating current is between an upper current threshold and a lower current threshold lower than the upper current threshold. The bias modulation circuit is also configured to increase the bias current in response to the level of the alternating current being between the upper current threshold and the lower current threshold.

In another aspect, an ET power management circuit is provided. The ET power management circuit includes a number of ET voltage tracker circuits. Each of the ET voltage tracker circuits includes amplifier circuitry that includes a voltage output. The amplifier circuitry is configured to operate based on a ET target voltage and a bias current to generate an ET modulated voltage at the voltage output. The amplifier circuitry is also configured to cause an alternating current to flow through the voltage output. Each of the ET voltage tracker circuits also includes a bias modulation circuit. The bias modulation circuit is configured to determine whether a level of the alternating current is between an upper current threshold and a lower current threshold lower than the upper current threshold. The bias modulation circuit is also configured to increase the bias current in response to the level of the alternating current being between the upper current threshold and the lower current threshold.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 3:
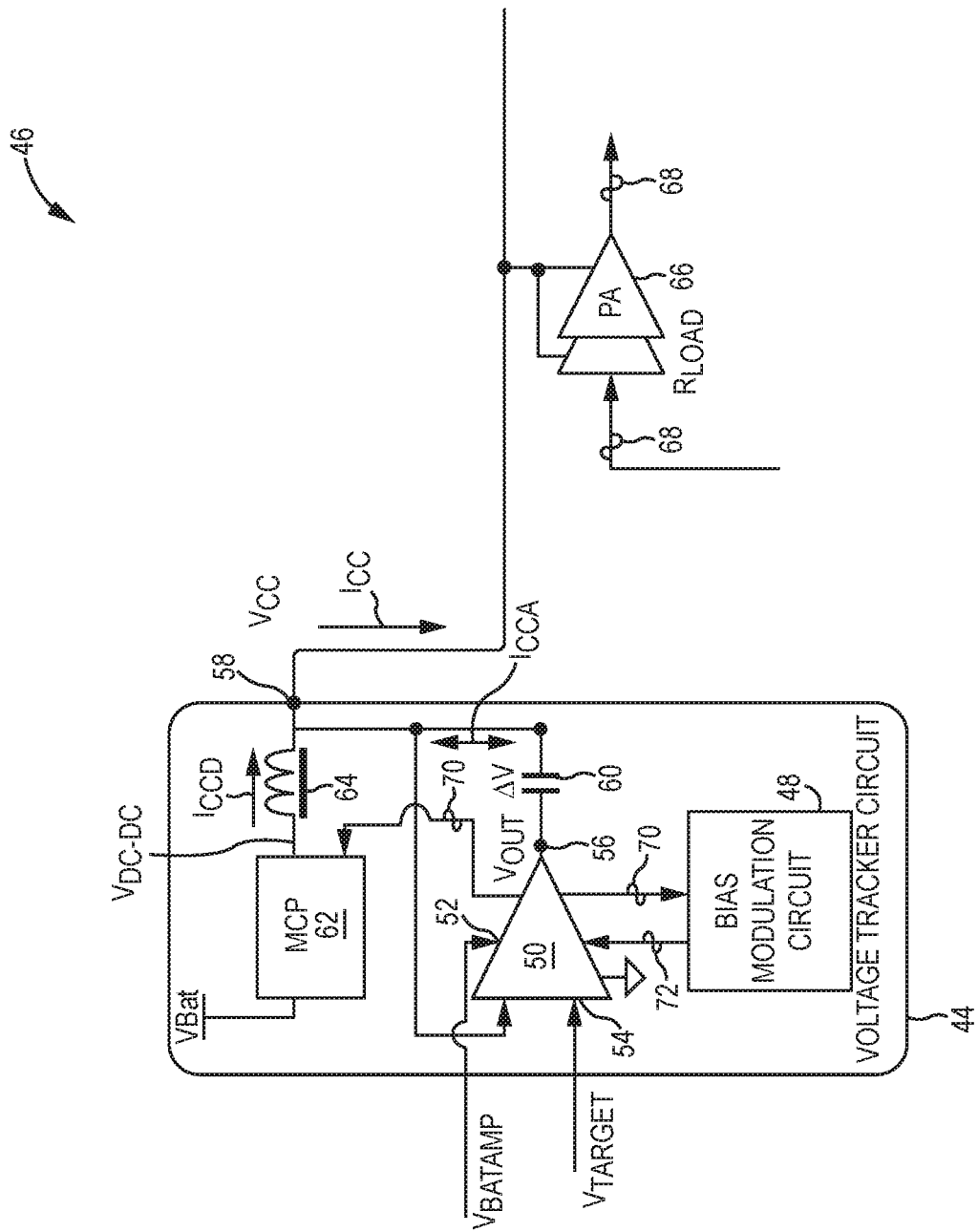
FIG. 3 is a schematic diagram of an exemplary ET voltage tracker circuit provided in an ET power management circuit and configured to dynamically reduce cross over distortions according to an embodiment of the present disclosure.
Figure 4:
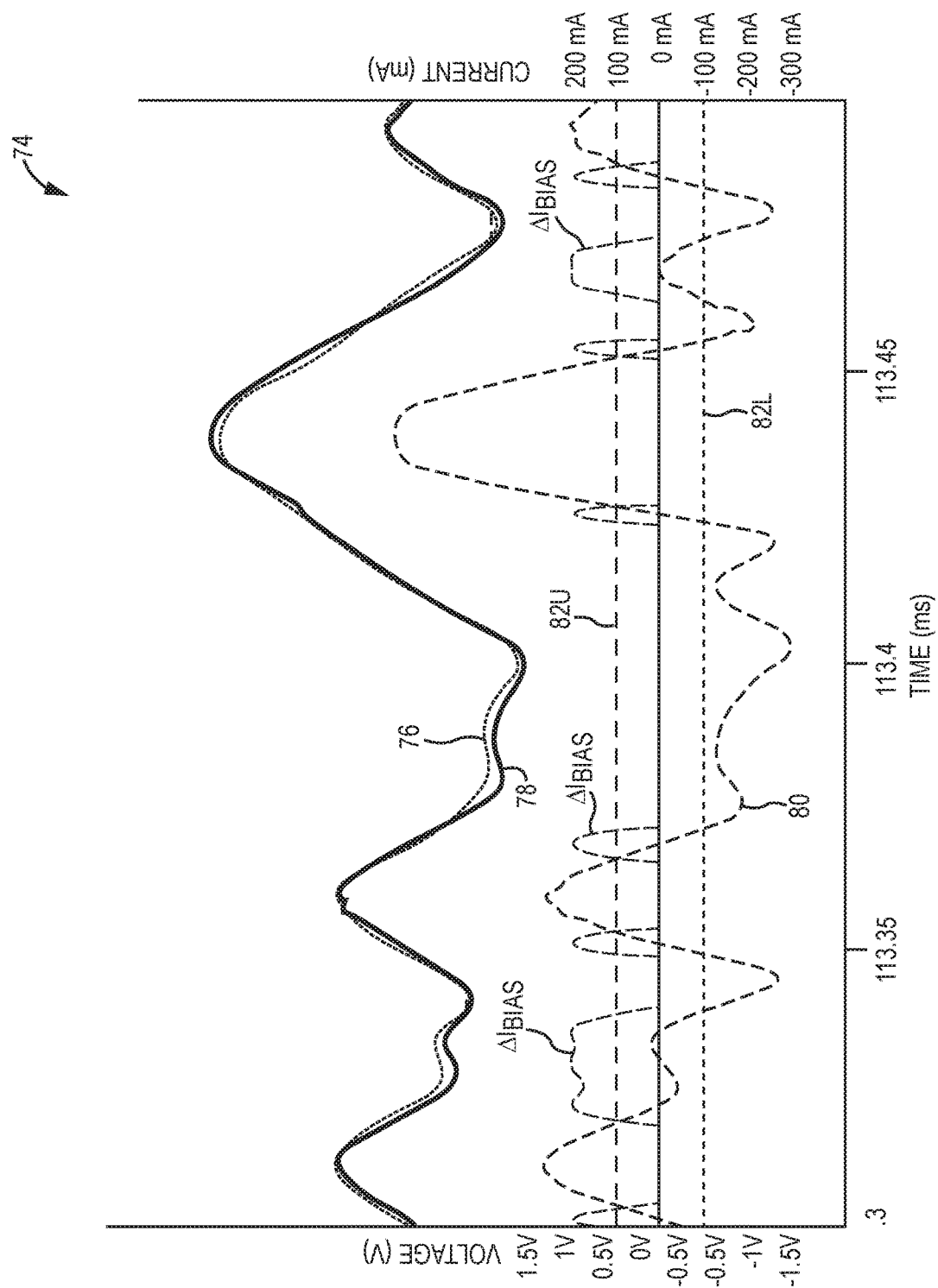
Figure 5:
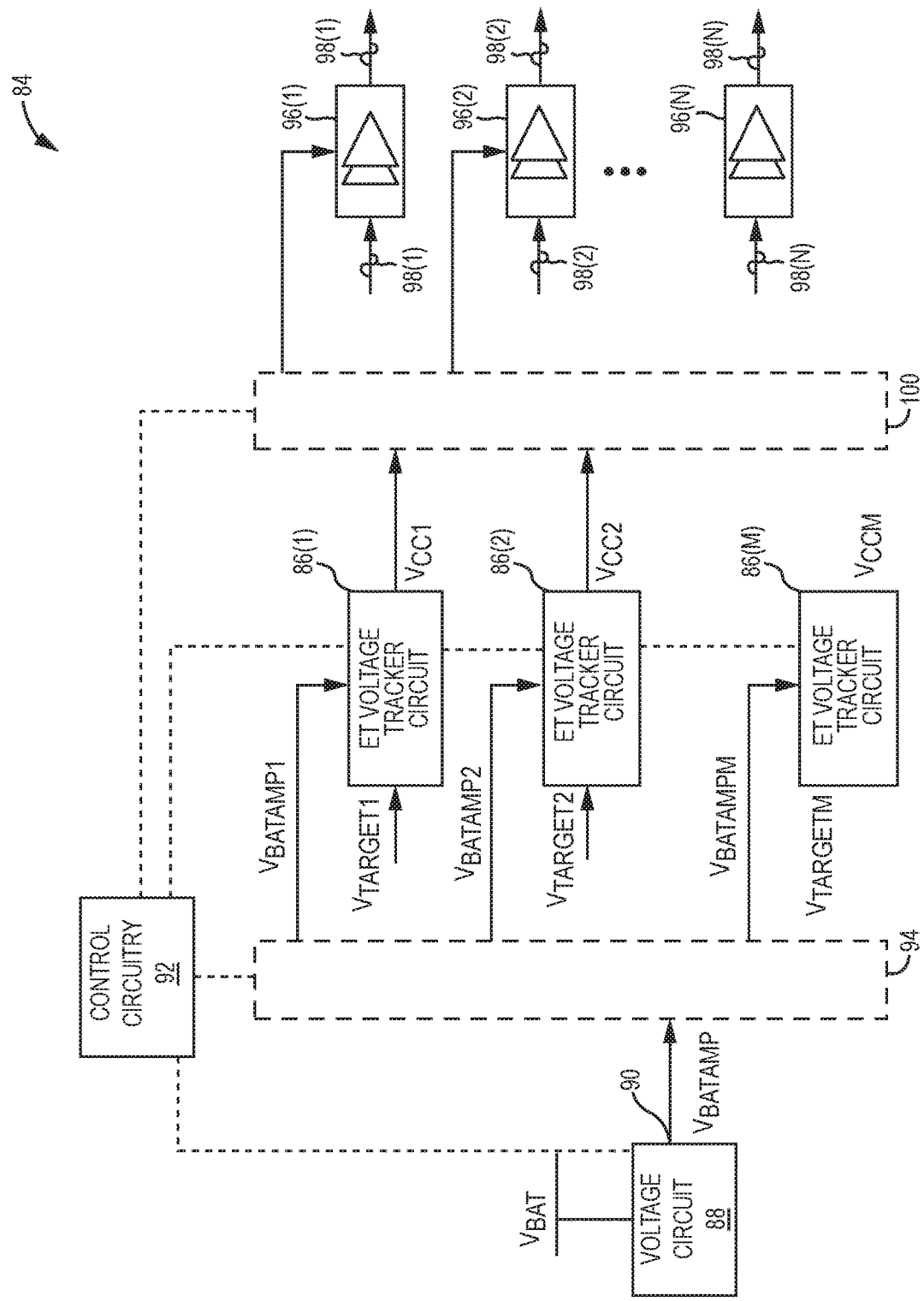

FIG. 4 is a graphic diagram providing an exemplary illustration of adjusting a bias current in the ET voltage tracker circuit of FIG. 3 to reduce the cross over distortions; and FIG. 5 is a schematic diagram of an exemplary ET power management circuit in which a number of ET voltage tracker circuits are each configured according to the ET voltage tracker circuit of FIG. 3 to reduce the cross over distortions.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to an envelope tracking (ET) voltage tracker circuit and related power management circuit. In examples discussed herein, an ET power management circuit includes an amplifier circuit(s) configured to amplify a radio frequency (RF) signal(s) based on an ET modulated voltage provided by an ET voltage tracker circuit(s). The ET voltage tracker circuit(s) includes amplifier circuitry, which operates based on an ET target voltage and a bias current to generate the ET modulated voltage. However, the ET modulated voltage may deviate from the ET target voltage from time to time due to cross over distortions in the ET voltage tracker circuit(s). In this regard, the ET voltage tracker circuit includes a bias modulation circuit to dynamically determine the cross over distortion and adjust the bias current to reduce deviations of the ET modulated voltage. As a result, the ET modulated voltage can track the ET target voltage more closely, thus helping to improve linearity performance and efficiency of the amplifier circuit(s).

Figure 1:
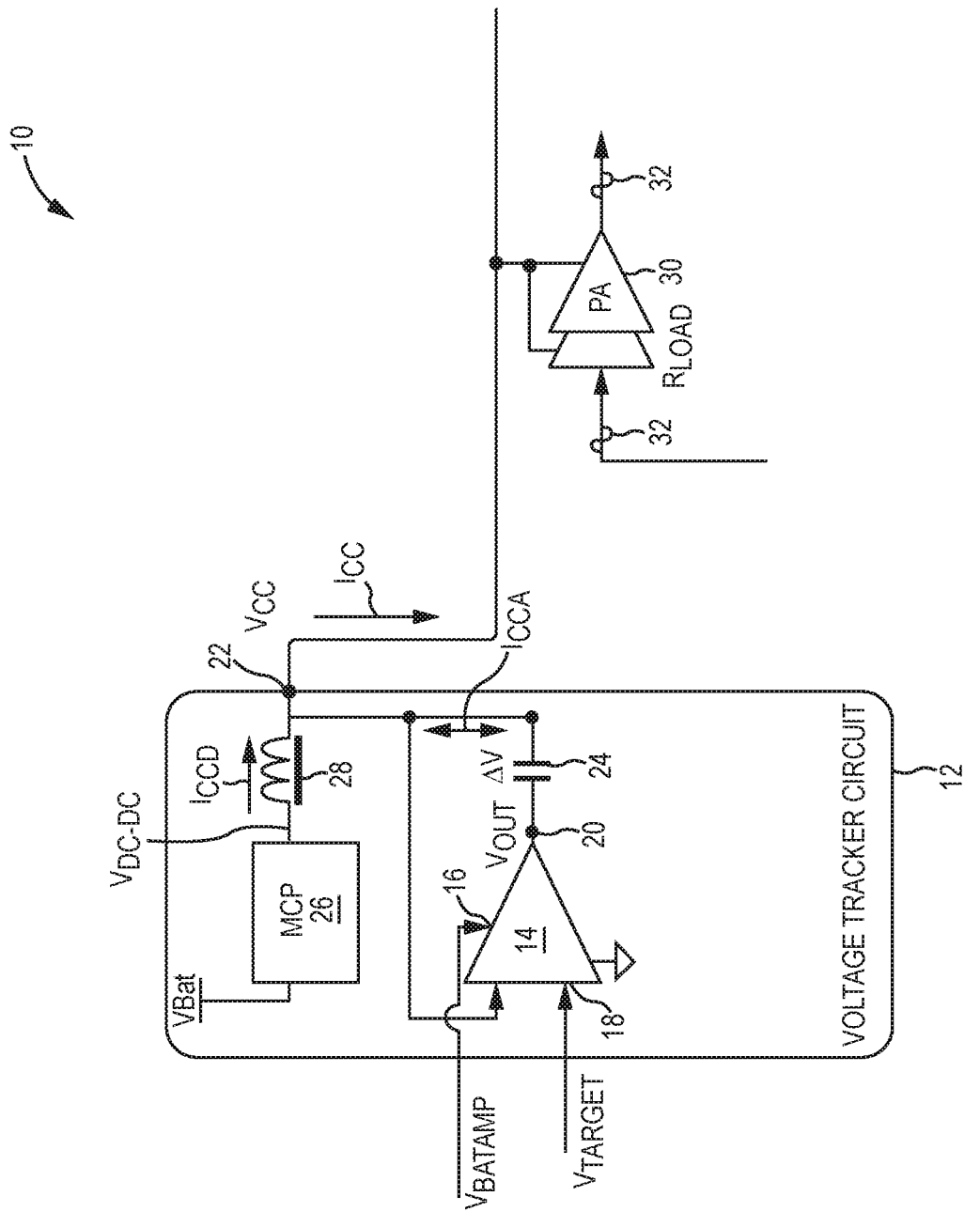
FIG. 1 is a schematic diagram of an existing envelope tracking (ET) power management circuit that may suffer ET modulated voltage deviation as a result of cross over distortions in an existing ET voltage tracker circuit.
Figure 2:
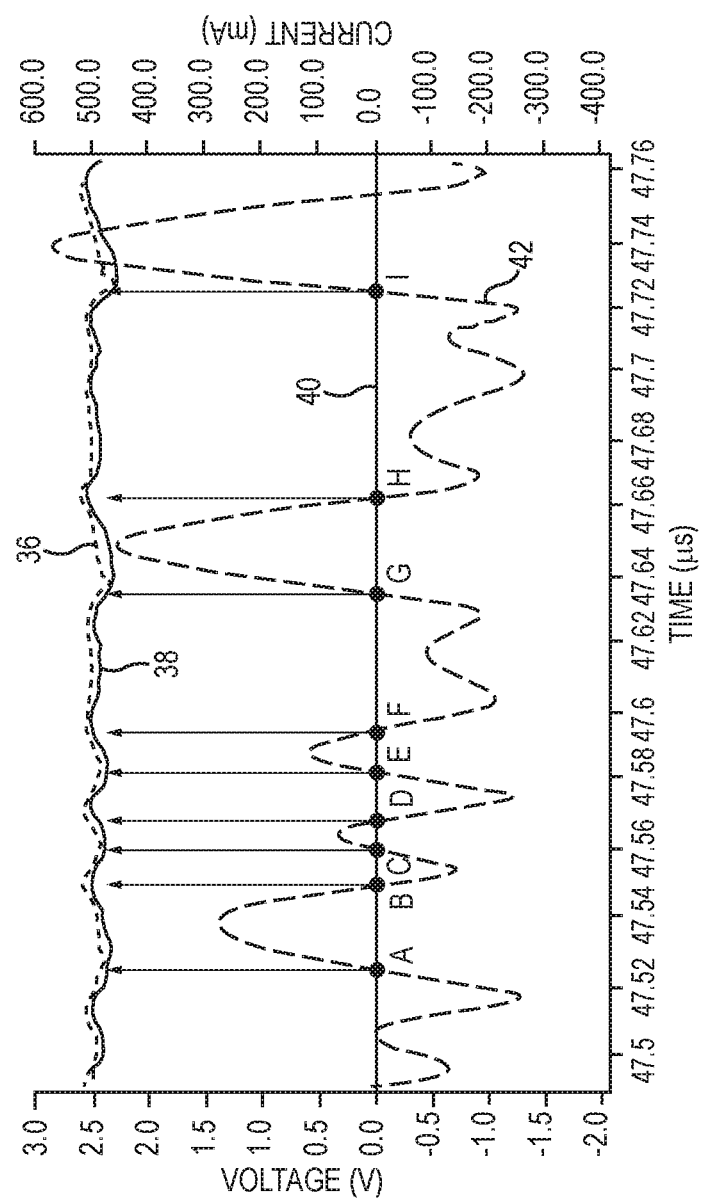
FIG. 2 is a graphic diagram providing an exemplary illustration of ET modulated voltage deviation as a result of the cross over distortions in the existing ET voltage tracker circuit of FIG. 1.

Before discussing the ET voltage tracker circuit and related ET power management circuit of the present disclosure, a brief overview of an existing ET power management circuit that may suffer ET modulated voltage deviation as a result of cross over distortion is first provided with reference to FIGS. 1 and 2. The discussion of specific exemplary aspects of an ET voltage tracker circuit and related ET power management circuit according to the present disclosure starts below with reference to FIG. 3.

FIG. 1 is a schematic diagram of an existing ET power management circuit 10 that may suffer ET modulated voltage deviation as a result of cross over distortions in an existing ET voltage tracker circuit 12. The existing ET voltage tracker circuit 12 includes amplifier circuitry 14. The amplifier circuitry 14 includes a supply voltage input 16, a target voltage input 18, and a voltage output 20. The amplifier circuitry 14 receives a supply voltage $V_{BATAMP}$ and an ET target voltage $V_{TARGET}$ via the supply voltage input 16 and the target voltage input 18, respectively. Accordingly, the amplifier circuitry 14 generates an ET modulated voltage $V_{OUT}$ at the voltage output 20 based on the supply voltage $V_{BATAMP}$ and in accordance to the ET target voltage $V_{TARGET}$.

The voltage output 20 is coupled to a tracker output 22 via an offset capacitor 24. In a non-limiting example, the offset capacitor 24 raises the ET modulated voltage $V_{OUT}$ by a predefined offset voltage ($\Delta v$) to generate a ET modulated output voltage $V_{CC}$ ($V_{CC}=V_{OUT}+\Delta v$) and provides the ET modulated output voltage $V_{CC}$ to the tracker output 22.

The existing ET voltage tracker circuit 12 includes a multilevel charge pump (MCP) 26 configured to generate a direct-current-to-direct-current (DC-DC) voltage $V_{DC\text{-}DC}$ and an inductor 28 configured to induce a direct current $I_{CCD}$ based on the DC-DC voltage $V_{DC\text{-}DC}$. The direct current $I_{CCD}$ is provided to the tracker output 22.

The existing ET power management circuit 10 includes an amplifier circuit 30 configured to amplify an RF signal 32 based on the ET modulated output voltage $V_{CC}$. Given that the amplifier circuit 30 has an inherent load line $R_{LOAD}$, a load current $I_{CC}$ ($I_{CC}=V_{CC}/R_{LOAD}$) needs to flow through the amplifier circuit 30 such that the amplifier circuit 30 can amplify the RF signal 32 to a desired power level.

When the RF signal 32 is modulated with a lower modulation bandwidth (e.g., ≤4 MHz), the direct current $I_{CCD}$ induced by the inductor 28 may be sufficient to provide the load current $I_{CC}$. In this regard, the amplifier circuitry 14 may be required to sink an alternating current $I_{CCA}$ caused by the inductor 28. Accordingly, the alternating current $I_{CCA}$ flows through the voltage output 20 and is sunk by the amplifier circuitry 14.

In contrast, when the RF signal 32 is modulated with a higher modulation bandwidth (e.g., >4 MHz), the direct current $I_{CCD}$ induced by the inductor 28 may be insufficient to provide the load current $I_{CC}$. In this regard, the amplifier circuitry 14 would need to source the alternating current $I_{CCA}$ to make up the current deficit. Accordingly, the alternating current $I_{CCA}$ flows through the voltage output 20 toward the tracker output 22.

In this regard, the amplifier circuitry 14 may toggle between sourcing the alternating current $I_{CCA}$ and sinking the alternating current $I_{CCA}$ from time to time. Accordingly, the alternating current $I_{CCA}$ will crisscross zero milliamps (0 mA) threshold (hereinafter referred to as "current cross over") in response to being sourced or sunk by the amplifier circuitry 14. Unfortunately, the current cross over can create cross over distortion that causes the ET modulated voltage $V_{CC}$ to deviate from the ET modulated target voltage $V_{TARGET}$, as illustrated in FIG. 2 below.

FIG. 2 is a graphic diagram 34 providing an exemplary illustration of ET modulated voltage deviation caused by the cross over distortions in the existing ET voltage tracker circuit 12 of FIG. 1. FIG. 2 includes an ET target voltage ($V_{TARGET}$) curve 36, an ET modulated voltage ($V_{OUT}$) curve 38, a 0 mA threshold curve 40, and an alternating current ($I_{CCA}$) curve 42. For example, the $I_{CCA}$ curve 42 crisscrosses the 0 mA threshold curve 40 at a number of current cross over points A, B, C, D, E, F, G, H, and I. As shown in FIG. 2, the $V_{OUT}$ curve 38 deviates from the $V_{TARGET}$ curve 36 at each of the current cross over points as a result of the cross over distortions caused by the current cross over. Notably, the cross over distortions associated with the ET modulated voltage $V_{OUT}$ can cause the ET modulated output voltage $V_{CC}$ to deviate from the ET target voltage $V_{TARGET}$. Consequently, the amplifier circuit 30 can suffer deteriorated linearity and efficiency. As such, it may be desirable to dynamically determine the current cross over points A-I and take appropriate measure to reduce the cross over distortions associated with the ET modulated voltage $V_{OUT}$ and the ET modulated output voltage $V_{CC}$.

In this regard, FIG. 3 is a schematic diagram of an exemplary ET voltage tracker circuit 44 provided in an ET power management circuit 46 and configured to dynamically reduce cross over distortions according to an embodiment of the present disclosure. As discussed in detail below, the ET voltage tracker circuit 44 employs a bias modulation circuit 48. The bias modulation circuit 48 is configured to dynamically detect current cross points, such as the current cross over points A-I of FIG. 2. Accordingly, the bias modulation circuit 48 is further configured to reduce the cross over distortions associated with the current cross over points. By providing the bias modulation circuit 48 in the ET voltage tracker circuit 44 to dynamically detect the current cross over points and reduce the cross over distortions associated with the current cross over points, it may be possible to improve linearity performance and efficiency of the ET power management circuit 46.

The ET voltage tracker circuit 44 includes amplifier circuitry 50. The amplifier circuitry 50 includes a supply voltage input 52, a target voltage input 54, and a voltage output 56. The amplifier circuitry 50 receives a supply voltage $V_{BATAMP}$ and an ET target voltage $V_{TARGET}$ via the supply voltage input 52 and the target voltage input 54, respectively. Accordingly, the amplifier circuitry 50 generates an ET modulated voltage $V_{OUT}$ at the voltage output 56 based on the supply voltage $V_{BATAMP}$ and in accordance to the ET target voltage $V_{TARGET}$.

The voltage output 56 is coupled to a tracker output 58 via an offset capacitor 60. In a non-limiting example, the offset capacitor 60 raises the ET modulated voltage $V_{OUT}$ by a predefined offset voltage ($\Delta v$) to generate a ET modulated output voltage $V_{CC}$ ($V_{CC}=V_{OUT}+\Delta v$) and provides the ET modulated output voltage $V_{CC}$ to the tracker output 58.

The existing ET voltage tracker circuit 44 includes an MCP 62 configured to generate a DC-DC voltage $V_{DC\text{-}DC}$ and an inductor 64 configured to induce a direct current $I_{CCD}$ based on the DC-DC voltage $V_{DC\text{-}DC}$. The direct current $I_{CCD}$ is provided to the tracker output 58.

The ET power management circuit 46 includes an amplifier circuit 66 configured to amplify an RF signal 68 based on the ET modulated output voltage $V_{CC}$. Given that the amplifier circuit 66 has an inherent load line $R_{LOAD}$, a load current $I_{CC}$ ($I_{CC}=V_{CC}/R_{LOAD}$) needs to flow through the amplifier circuit 66 such that the amplifier circuit 66 can amplify the RF signal 68 to a desired power level.

When the RF signal 68 is modulated with a lower modulation bandwidth (e.g., ≤4 MHz), the direct current $I_{CCD}$ induced by the inductor 64 may be sufficient to provide the load current $I_{CC}$. In this regard, the amplifier circuitry 50 may be required to sink an alternating current $I_{CCA}$ caused by the inductor 64. Accordingly, the alternating current $I_{CCA}$ flows through the voltage output 56 and is sunk by the amplifier circuitry 50.

In contrast, when the RF signal 68 is modulated with a higher modulation bandwidth (e.g., >4 MHz), the direct current $I_{CCD}$ induced by the inductor 64 may be insufficient to provide the load current $I_{CC}$. In this regard, the amplifier circuitry 50 would need to source the alternating current $I_{CCA}$ to make up the current deficit. Accordingly, the alternating current $I_{CCA}$ flows through the voltage output 56 toward the tracker output 58.

The amplifier circuitry 50 is configured to generate a sense current 70 indicative of a level of the alternating current $I_{CCA}$ being sourced or sunk by the amplifier circuitry 50. In a non-limiting example, the sense current 70 is positive when the amplifier circuitry 50 sources the alternating current $I_{CCA}$ and negative when the amplifier circuitry 50 sinks the alternating current $I_{CCA}$. In another non-limiting example, a quantitative level of the sense current 70 can be identical or proportional to an actual level of the alternating current $I_{CCA}$ flowing through the voltage output 56. The sense current 70 can be utilized by the MCP 62 to help adjust the DC-DC voltage $V_{DC-DC}$ and thus the direct current $I_{CCD}$ in response to variations of the alternating current $I_{CCA}$. In addition, the sense current 70 can be utilized by the bias modulation circuit 48 to help detect dynamically the current cross over points like the current cross over points A-I of FIG. 2.

In this regard, the bias modulation circuit 48 can utilize the sense current 70 to help determine whether the level of the alternating current $I_{CCA}$ flowing through the voltage output 56 is approaching a current cross over point (e.g., the current cross over points A-I of FIG. 2). More specifically, the bias modulation circuit 48 can be configured to determine whether the level of the alternating current $I_{CCA}$ falls within an upper current threshold $T_U$ and a lower current threshold $T_L$, which is lower than the upper current threshold $T_U$ ($T_L<T_U$). In one non-limiting example, the upper current threshold $T_U$ is a positive current threshold greater than 0 mA (e.g., 100 mA) and the lower current threshold $T_L$ is a negative threshold lower than 0 mA (e.g., −100 mA). For example, the upper current threshold $T_U$ is above the 0 mA threshold curve 40 of FIG. 2 and the lower current threshold $T_U$ is below the 0 mA threshold curve 40 of FIG. 2.

In this regard, whenever the level of the alternating current $I_{CCA}$ falls between the upper current threshold $T_U$ and the lower current threshold $T_L$, it may be seen as an indication that the alternating current $I_{CCA}$ is approaching the 0 mA (e.g., current cross over point). As such, the bias modulation circuit 48 can dynamically detect the current cross overs and takes appropriate action accordingly. Notably, the upper current threshold $T_U$ and the lower current threshold $T_L$ can be determined based on how aggressive the bias modulation circuit 48 needs to respond to the current cross overs.

The amplifier circuitry 50 may include various active components (e.g., transistors) that are configured to operate based on a bias current 72. In a non-limiting example, the bias current 72 can be a direct current that determines operating points (also known as quiescent points or Q-points) of the various active components inside the amplifier circuitry 50. The Q-points are typically set to near middle of the DC load lines of the various active components. In this regard, the various active components in the amplifier circuitry 50 are preconfigured to operate based on an ideal level of the bias current 72 such that the amplifier circuitry 50 can generate the ET modulated voltage $V_{OUT}$ with maximum available peak-to-peak amplitude without clipping the ET modulated voltage $V_{OUT}$.

In a non-limiting example, the bias modulation circuit 48 can be configured to increase the level of the bias current 72 (e.g., above the ideal level) in response to the level of the alternating current $I_{CCA}$ being lower than or equal to the upper current threshold. By increasing the bias current 72, it may be possible to change the operating point (e.g., Q-point) of the various active components in the amplifier circuitry 50. As a result, it may be possible to reduce the cross over distortion in the ET modulated voltage $V_{OUT}$ and thus the ET modulated output voltage $V_{CC}$.

In contrast, when the bias modulation circuit 48 determines that the level of the alternating current $I_{CCA}$ is outside the upper current threshold and the lower current threshold, it may be an indication that the alternating current $I_{CCA}$ is not approaching or is departing from the current cross over points. For example, when the bias modulation circuit 48 determines that the level of the alternating current $I_{CCA}$ is greater than the upper current threshold (e.g., >100 mA) or lower than the lower current threshold (e.g., <−100 mA), the bias modulation circuit 48 can reduce the bias current 72 to the ideal level, if the bias modulation circuit 48 has previously increased the bias current 72 to above the ideal level. The bias modulation circuit 48 may simply maintain the bias current 72 at the ideal level if the bias modulation circuit 48 has not increased the bias current 72 above the ideal level.

FIG. 4 is a graphic diagram 74 providing an exemplary illustration of adjusting the bias current 72 in the ET voltage tracker circuit 44 of FIG. 3 to reduce the cross over distortions. The graphic diagram 74 includes a $V_{TARGET}$ curve 76, a $V_{CC}$ curve 78, and an $I_{CCA}$ curve 80. Whenever the bias modulation circuit 48 of FIG. 3 determines that the $I_{CCA}$ curve 80 is between an upper current threshold 82U and a lower current threshold 82L, the bias modulation circuit 48 increases the bias current 72 from the ideal level by a positive delta bias current $\Delta_{BIAS}$. As a result, as illustrated in FIG. 4, the $V_{CC}$ curve 78 becomes better aligned with the $V_{TARGET}$ curve 76, indicating a reduction in the cross over distortion.

The ET voltage tracker circuit 44 can be provided in an ET power management circuit supporting a number of amplifier circuits. In this regard, FIG. 5 is a schematic diagram of an exemplary ET power management circuit 84 in which a number of ET voltage tracker circuits 86(1)-86(M) each configured according to the ET voltage tracker circuit 44 of FIG. 3 to reduce the cross over distortions.

The ET voltage tracker circuits 86(1)-86(M) are configured to receive a number of input voltages $V_{BATAMP1}$-$V_{BATAMPM}$ and generate a number of ET modulated output voltages $V_{CC1}$-$V_{CCM}$ based on the input voltages $V_{BATAMP1}$-$V_{BATAMPM}$, respectively. The ET voltage tracker circuits 86(1)-86(M) also receive a number of target voltages $V_{TARGET1}$-$V_{TARGETM}$, each representing a time-variant voltage envelope. Accordingly, the ET voltage tracker circuits 86(1)-86(M) generate the ET modulated output voltages $V_{CC1}$-$V_{CCM}$ that track the time-variant envelope of the target voltages $V_{TARGET1}$-$V_{TARGETM}$, respectively.

Notably, each of the ET voltage tracker circuits 86(1)-86(M) may suffer the cross over distortions as discussed earlier in FIGS. 1 and 2. As such, each of the ET voltage tracker circuits 86(1)-86(M) can be configured to include the bias modulation circuit 48 of FIG. 3 to detect the current cross over points and reduce the cross over distortions.

The ET power management circuit 84 includes a voltage circuit 88 that is configured to generate a supply voltage $V_{BATAMP}$ at a voltage output 90. In a non-limiting example, the voltage circuit 88 derives the supply voltage $V_{BATAMP}$, which can be a constant voltage, from a battery voltage $V_{BAT}$. The voltage circuit 88 may be an inductor-based buck-boost circuit or a capacitor-based buck-boost circuit.

The ET power management circuit 84 includes control circuitry 92, which can be provided as a microprocessor, a microcontroller, or a field-programmable gate array (FPGA), for example. The control circuitry 92 can be configured to couple the voltage output 90 to the ET voltage tracker circuits 86(1)-86(M) to provide the supply voltage $V_{BATAMP}$ to the ET voltage tracker circuits 86(1)-86(M) as the input voltages $V_{BATAMP1}$-$V_{BATAMPM}$.

In a non-limiting example, the control circuitry 92 can couple the voltage output 90 to via input voltage switching circuitry 94. The input voltage switching circuitry 94 may be constructed based on any number, type, and/or layout of switches to couple the voltage output 90 to the ET voltage tracker circuits 86(1)-86(M).

The ET power management circuit 84 includes a number of amplifier circuits 96(1)-96(N) configured to amplify a number of RF signals 98(1)-98(N), respectively, based on a selected number of the ET modulated voltages $V_{CC1}$-$V_{CCM}$ generated by the ET voltage tracker circuits 86(1)-86(M). Notably, when the ET power management circuit 84 is supporting the ULCA operation, the RF signals 98(1)-98(N) may be different signals. In contrast, when the ET power management circuit 84 is supporting the MIMO operation, the RF signals 98(1)-98(N) may be identical signals.

The ET power management circuit 84 may include output voltage switching circuitry 100. The output voltage switching circuitry 100 may be constructed based on any number, type, and/or layout of switches to selectively provide the selected number of the ET modulated voltages $V_{CC1}$-$V_{CCM}$ to one or more of the amplifier circuits 96(1)-96(N).

Those skilled in the art will recognize improvements and modifications to the preferred embodiments of the present disclosure. All such improvements and modifications are considered within the scope of the concepts disclosed herein and the claims that follow.

What is claimed is:

1. An envelope tracking (ET) voltage tracker circuit comprising:
    amplifier circuitry comprising a voltage output and configured to:
        operate based on an ET target voltage and a bias current to generate an ET modulated voltage at the voltage output for amplifying a radio frequency (RF) signal; and
        cause an alternating current to flow through the voltage output in response to the RF signal being modulated above a defined modulation bandwidth; and
    a bias modulation circuit configured to:
        determine whether a level of the alternating current is between an upper current threshold and a lower current threshold lower than the upper current threshold, wherein the upper current threshold and the lower current threshold are configured to indicate whether the alternating current is approaching a defined current cross over point in between the upper current threshold and the lower current threshold; and
        increase the bias current in response to the level of the alternating current being between the upper current threshold and the lower current threshold.

2. The ET voltage tracker circuit of claim 1 wherein the amplifier circuitry is further configured to:
    receive the ET target voltage having a time-variant target voltage envelope; and
    generate the ET modulated voltage having a time-variant voltage envelope tracking the time-variant target voltage envelope.

3. The ET voltage tracker circuit of claim 2 wherein the bias modulation circuit is further configured to increase the bias current to reduce a deviation between the ET modulated voltage and the ET target voltage.

4. The ET voltage tracker circuit of claim 2 wherein the bias modulation circuit is further configured to determine whether the level of the alternating current is between the upper current threshold and the lower current threshold based on the time-variant target voltage envelope of the ET target voltage.

5. The ET voltage tracker circuit of claim 1 wherein the bias modulation circuit is further configured to decrease the bias current in response to the level of the alternating current being outside the upper current threshold and the lower current threshold.

6. The ET voltage tracker circuit of claim 1 wherein the amplifier circuitry is preconfigured to operate based on an ideal level of the bias current.

7. The ET voltage tracker circuit of claim 6 wherein the bias modulation circuit is further configured to increase the bias current above the ideal level of the bias current in response to the level of the alternating current being lower than or equal to the upper current threshold and higher than or equal to the lower current threshold.

8. The ET voltage tracker circuit of claim 7 wherein the bias modulation circuit is further configured to decrease the bias current to the ideal level of the bias current in response to the level of the alternating current being higher than the upper current threshold or lower than the lower current threshold.

9. The ET voltage tracker circuit of claim 1 wherein the amplifier circuitry is further configured to generate a sense current indicative of the level of the alternating current caused by the amplifier circuitry at the voltage output.

10. The ET voltage tracker circuit of claim 9 wherein the sense current is proportionally related to the level of the alternating current flowing through the voltage output.

11. The ET voltage tracker circuit of claim 9 wherein the amplifier circuitry is further configured to:
    generate the sense current as a positive sense current in response to the amplifier circuitry sourcing the alternating current; and
    generate the sense current as a negative sense current in response to the amplifier circuitry sinking the alternating current.

12. The ET voltage tracker circuit of claim 9 wherein the bias modulation circuit is further configured to determine whether the level of the alternating current is between the upper current threshold and the lower current threshold based on the sense current.

13. The ET voltage tracker circuit of claim 9 further comprising a tracker output coupled to the voltage output of the amplifier circuitry via an offset capacitor, wherein the offset capacitor is configured to raise the ET modulated voltage to an ET modulated output voltage and provide the ET modulated voltage to the tracker output.

14. The ET voltage tracker circuit of claim 13 further comprising:
    a multilevel charge pump configured to generate a direct-current-to-direct-current (DC-DC) voltage; and
    an inductor coupled between the multilevel charge pump and the tracker output, the inductor configured to induce a direct current at the tracker output based on the DC-DC voltage.

15. The ET voltage tracker circuit of claim 1 wherein the upper current threshold is greater than 0 mA and the lower current threshold is smaller than 0 mA.

16. An envelope tracking (ET) power management circuit comprising a plurality of ET voltage tracker circuits, each of the plurality of ET voltage tracker circuits comprising:
    amplifier circuitry comprising a voltage output and configured to:
        operate based on a ET target voltage and a bias current to generate an ET modulated voltage at the voltage output for amplifying a radio frequency (RF) signal; and
        cause an alternating current to flow through the voltage output in response to the RF signal being modulated above a defined modulation bandwidth; and
    a bias modulation circuit configured to:
        determine whether a level of the alternating current is between an upper current threshold and a lower current threshold lower than the upper current threshold, wherein the upper current threshold and the lower current threshold are configured to indicate whether the alternating current is approaching a defined current cross over point in between the upper current threshold and the lower current threshold; and increase the bias current in response to the level of the alternating current being between the upper current threshold and the lower current threshold.

17. The ET power management circuit of claim 16 wherein the amplifier circuitry is further configured to generate a sense current indicative of the level of the alternating current caused by the amplifier circuitry at the voltage output.

18. The ET power management circuit of claim 17 wherein each of the plurality of ET voltage tracker circuits further comprises a tracker output coupled to the voltage output of the amplifier circuitry via an offset capacitor, wherein the offset capacitor is configured to raise the ET modulated voltage to an ET modulated output voltage and provide the ET modulated output voltage to the tracker output.

19. The ET power management circuit of claim 18 wherein each of the plurality of ET voltage tracker circuits further comprises:
 a multilevel charge pump configured to generate a direct-current-to-direct-current (DC-DC) voltage; and
 an inductor coupled between the multilevel charge pump and the tracker output, the inductor configured to induce a direct current at the tracker output based on the DC-DC voltage.

20. The ET power management circuit of claim 19 further comprising an amplifier circuit coupled to the tracker output and configured to amplify the radio frequency (RF) signal based on the ET modulated output voltage and the direct current.

* * * * *